United States Patent
McIntyre et al.

(10) Patent No.: US 10,692,749 B2
(45) Date of Patent: Jun. 23, 2020

(54) METHOD TO PROVIDE CONSISTENT ELECTROSTATIC CLAMPING THROUGH REAL TIME CONTROL OF ELECTROSTATIC CHARGE DEPOSITION IN AN ELECTROSTATIC CHUCK

(71) Applicant: Axcelis Technologies, Inc., Beverly, MA (US)

(72) Inventors: Edward K. McIntyre, Franklin, MA (US); William P. Reynolds, Canton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 275 days.

(21) Appl. No.: 15/831,972

(22) Filed: Dec. 5, 2017

(65) Prior Publication Data

US 2019/0172743 A1    Jun. 6, 2019

(51) Int. Cl.
| | |
|---|---|
| *H01L 21/683* | (2006.01) |
| *H02N 13/00* | (2006.01) |
| *G01R 19/14* | (2006.01) |
| *G01R 22/10* | (2006.01) |
| *H01L 21/67* | (2006.01) |
| *H01L 21/687* | (2006.01) |

(52) U.S. Cl.
CPC .......... *H01L 21/6833* (2013.01); *G01R 19/14* (2013.01); *G01R 22/10* (2013.01); *H01L 21/67288* (2013.01); *H01L 21/68707* (2013.01); *H02N 13/00* (2013.01)

(58) Field of Classification Search
CPC ........... H01L 21/6833; H01L 21/68707; H01L 21/67288; G01R 22/10; G01R 19/14; H02N 13/00

USPC .................................................. 361/233–234
See application file for complete search history.

(56) References Cited

U.S. PATENT DOCUMENTS

| | | |
|---|---|---|
| 5,179,498 A | 1/1993 | Hongoh |
| 5,872,694 A | 2/1999 | Hoinkis |
| | (Continued) | |

OTHER PUBLICATIONS

Notice of Allowance dated Feb. 6, 2019 in connection with U.S. Appl. No. 13/729,524.

(Continued)

*Primary Examiner* — Dharti H Patel
(74) *Attorney, Agent, or Firm* — Eschweiler & Potashnik, LLC

(57) ABSTRACT

An electrostatic clamp monitoring system has an electrostatic clamp configured to selectively electrostatically clamp a workpiece to a clamping surface associated therewith via one or more electrodes. A power supply is electrically coupled to the electrostatic clamp and configured to selectively supply a clamping voltage at a clamping frequency to the electrostatic clamp. A data acquisition system measures a current supplied to the one or more electrodes, and a controller integrates the measured current over time, therein determining a charge value associated a clamping force between the workpiece and electrostatic clamp. The controller is further configured to selectively vary one or more of the clamping voltage and clamping frequency based on the determined charge value, thereby maintaining a desired clamping force between the workpiece and electrostatic clamp.

20 Claims, 4 Drawing Sheets

(56) References Cited

U.S. PATENT DOCUMENTS

| | | | |
|---|---|---|---|
| 5,894,400 A * | 4/1999 | Graven | ............... H01L 21/6831 |
| | | | 279/128 |
| 7,558,045 B1 | 7/2009 | Onate | |
| 10,324,121 B2 * | 6/2019 | McIntyre | ............... G01R 29/24 |
| 2011/0032654 A1 | 2/2011 | McAnn | |
| 2011/0199093 A1 | 8/2011 | Fujisawa | |
| 2014/0188416 A1 | 7/2014 | McIntyre et al. | |

OTHER PUBLICATIONS

International Preliminary Report on Patentability dated Mar. 26, 2019 in connection with International Application No. PCT/US2018/063858.

Final Office Action dated Dec. 22, 2016 in connection with U.S. Appl. No. 13/729,524.

Non-Final Office Action dated Jun. 23, 2016 in connection with U.S. Appl. No. 13/729,524.

Non-Final Office Action dated Nov. 6, 2015 in connection with U.S. Appl. No. 13/729,524.

* cited by examiner

METHOD TO PROVIDE CONSISTENT ELECTROSTATIC CLAMPING THROUGH REAL TIME CONTROL OF ELECTROSTATIC CHARGE DEPOSITION IN AN ELECTROSTATIC CHUCK

TECHNICAL FIELD

The present invention relates generally to an electrostatic clamp, and more specifically to a system and method for controlling electrostatic charge on the electrostatic clamp in real time, therein controlling a clamping force associated with the electrostatic clamp.

BACKGROUND

In semiconductor manufacturing, electrostatic clamps (also called electrostatic chucks or ESCs) are often utilized to hold a workpiece (e.g., a semiconductor wafer) in position while the workpiece undergoes various semiconductor processing, such as ion implantation. During such semiconductor processing, it is often desirable to accurately maintain the position of the workpiece with respect to the electrostatic clamp and/or maintain a temperature of the workpiece via backside cooling of the workpiece through the electrostatic clamp. Maintaining the position and/or temperature of the workpiece often requires the workpiece to maintain a predetermined contact pressure with a surface of the electrostatic clamp.

In order to maintain the position and/or predetermined contact pressure of the workpiece with respect to the electrostatic clamp, tests are often performed to ensure proper clamping forces are maintained throughout clamping and processing of the workpiece. Such tests can include workpiece lifting tests, wherein a force required to remove the workpiece from the electrostatic clamp is measured by a load cell coupled to a test workpiece. The force required to remove the workpiece is then utilized to determine an ability of the electrostatic clamp to maintain the clamping of the workpiece.

Another test for determining clamping forces attained by the electrostatic clamp is often utilized when backside gases are used for cooling of the workpiece during processing (a so-called "pop-off" test). Such backside gases are provided to a backside of the workpiece via orifices in the surface of the electrostatic clamp, wherein a pressure and/or flow of the backside gases at least partially counteracts the clamping force applied to the workpiece by the electrostatic clamp. The pressure or flow of the backside gas is increased to a level in which the workpiece separates from the electrostatic clamp, therein providing a measure of the clamping force associated with the separation, and thus, a condition of the clamping capability of the electrostatic clamp.

It is noted, however, that such clamping tests are often interruptive in a production environment, wherein specialized workpieces and/or devices are inserted into the processing equipment, thus expending valuable production time. Further, since the tests are intermittently performed (e.g., one test is performed between many workpiece clamping cycles), a quick deterioration of the clamping capability of the electrostatic clamp may not be readily recognized and corrected for.

Furthermore, once the conventional clamping tests are performed, a set of electrostatic clamping parameters (e.g., a voltage and frequency applied to the electrostatic clamp) are utilized for subsequent clamping, wherein the clamping parameters are not modified until a subsequent clamping test is performed. The clamping pressure generated in the electrostatic clamp can vary for many reasons, however, such as the age of the electrostatic clamp, coatings on the surface of the ESC, contamination present on the surface of the electrostatic clamp, etc. Heretofore, such variations of clamping pressure have not been adequately accounted for in real time, concurrent with the clamping of the workpiece.

SUMMARY

The present invention overcomes the limitations of the prior art by providing a system and method for assessing and maintaining a clamping capability associated with an electrostatic clamp independent of conventional mechanical testing. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with the present disclosure, a system for controlling electrostatic clamping pressure is provided, wherein an electrostatic clamp is configured to selectively electrostatically clamp a workpiece to a clamping surface associated therewith via one or more electrodes. A power supply is electrically coupled to the electrostatic clamp, wherein the power supply is configured to selectively supply a clamping voltage at a clamping frequency to the one or more electrodes of the electrostatic clamp. The power supply, in one example, comprises a three-phase alternating current power supply.

A data acquisition system is further operably coupled to the power supply and configured to measure a current associated with the one or more electrodes, such as a current supplied by the power supply to the one or more electrodes, therein defining a measured current. Alternatively, the current is measured directly from the one or more electrodes, such as via one or more electrical leads associated with the one or more electrodes.

A controller is further configured to integrate the measured current over time, therein defining a determined charge value associated with a clamping force between the workpiece and electrostatic clamp. According to one example, a memory is further configured to store the charge value associated with the clamping force between the workpiece and electrostatic clamp over a plurality of clamping cycles. The controller is further configured to selectively vary one or more of the clamping voltage and clamping frequency based on the determined charge value, thereby maintaining a desired clamping force between the workpiece and electrostatic clamp. For example, selectively varying the one or more of the clamping voltage and clamping frequency maintains the current supplied to the one or more electrodes, therein maintaining the desired clamping force between the workpiece and electrostatic clamp. The desired clamping force, for example, can comprise a range of desired clamping forces.

According to one example, the desired clamping force between the workpiece and electrostatic clamp is associated with a predetermined range of desired charge values. Selectively varying the one or more of the clamping voltage and clamping frequency thus maintains the current supplied to the one or more electrodes such that the determined charge value remains within the predetermined range of desired charge values.

In accordance with another example, a memory is configured to store the charge value associated with the clamping force. The memory can be configured to store a plurality of clamping voltages and a plurality of clamping frequencies associated with a respective plurality of charge values over a plurality of clamping cycles, wherein the controller is further configured to determine a clamping capability status of the electrostatic clamp based on a comparison of the determined charge value to the plurality of charge values.

The controller, for example, can comprise a numerical integrator configured to perform a numerical integration of the measured current. The power supply can comprise an A/C power supply, and wherein the data acquisition system is further configured to measure the current supplied to the one or more electrodes. The electrostatic clamp can comprise a three-phase electrostatic clamp, wherein the power supply is configured to selectively alternately supply a three phase clamping voltage to the one or more electrodes of the electrostatic clamp.

In accordance with another exemplary aspect, a method is provided for maintaining an electrostatic clamping force associated with an electrostatic clamp. In one example, a clamping voltage is applied at a clamping frequency to one or more electrodes of an electrostatic clamp, therein electrostatically attracting a workpiece to a clamping surface of the electrostatic clamp. A current associated with the clamping voltage and clamping frequency is measured, therein defining a measured current. The measured current is further integrated over time, therein defining a charge value associated with a clamping force between the workpiece and electrostatic clamp. One or more of the clamping voltage and clamping frequency is further controlled based on the charge value, therein maintaining the charge value generally constant or within a predetermined range of charge values. Controlling one or more of the clamping voltage and clamping frequency based on the charge value, for example, can maintain the clamping force within a desired range of clamping forces.

In another example, controlling one or more of the clamping voltage and clamping frequency is based, at least in part, on a model of charge values and clamping forces.

The above summary is merely intended to give a brief overview of some features of some embodiments of the present invention, and other embodiments may comprise additional and/or different features than the ones mentioned above. In particular, this summary is not to be construed to be limiting the scope of the present application. Thus, to the accomplishment of the foregoing and related ends, the invention comprises the features hereinafter described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
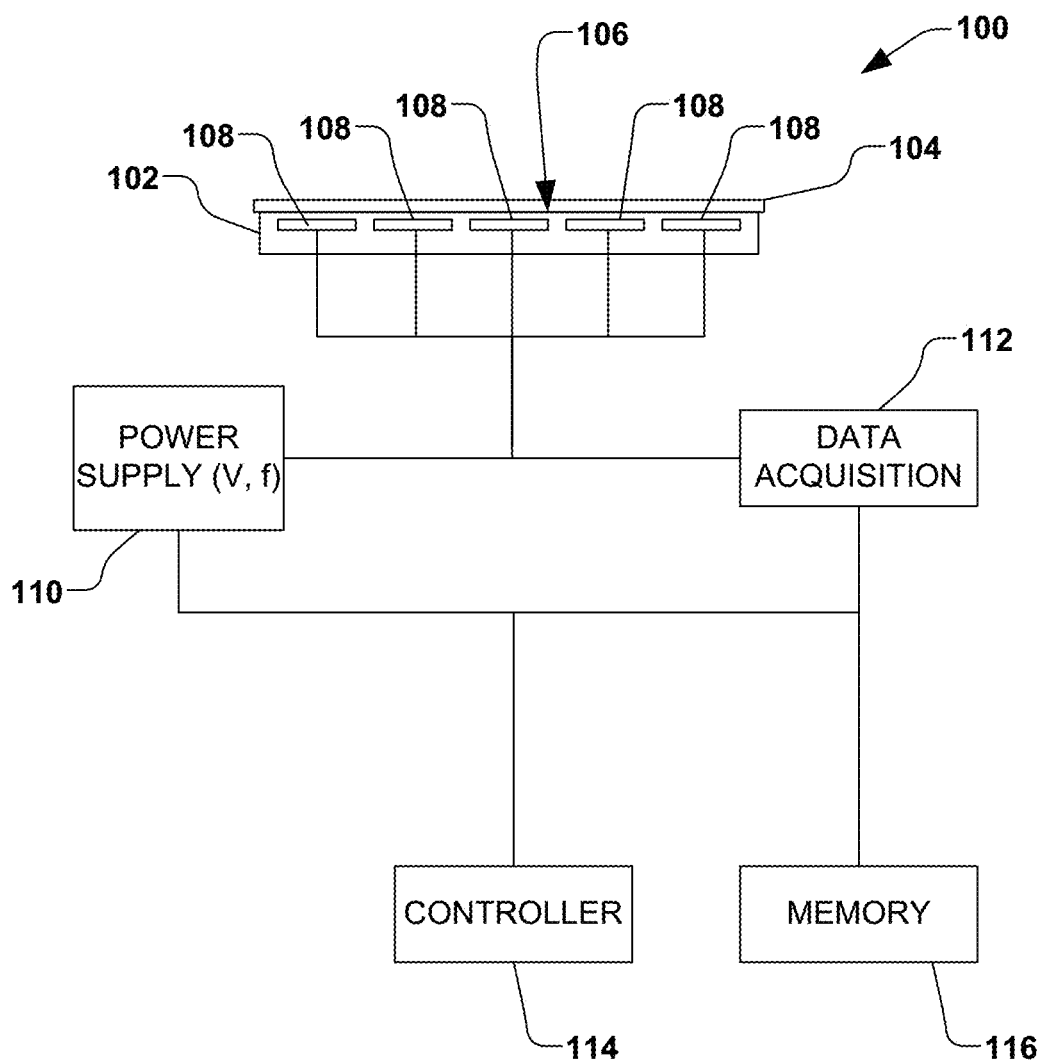
FIG. 1 is a block diagram of an electrostatic clamping system in accordance with several aspects of the present disclosure.

The present disclosure is directed generally toward a system and method for assessing and maintaining a clamping capability associated with an electrostatic clamp (also called an electrostatic chuck or ESC). In particular, a system and method for maintaining a generally constant clamping force associated with the electrostatic clamp is provided. Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

Electrostatic clamps conventionally operate at a fixed voltage and frequency applied thereto to clamp a workpiece thereto. The present disclosure appreciates that clamping forces associated with electrostatic clamps are dependent on the amount of electrical charge deposited on the electrostatic clamp and workpiece in a capacitive manner, and variations in the deposited charge for a given voltage and frequency setting will cause variations in the clamping pressure. The present disclosure provides a consistent amount of deposited charge, and thus provides a more consistent clamping force and consistent de-clamping performance. Accordingly, a consistent charge is deposited on the electrostatic clamp and workpiece by selectively varying the voltage and frequency in response to concurrent, in-situ conditions of the electrostatic clamping system. Thus, the present disclosure uses the deposited charge as feedback to modify the voltage or frequency applied to the electrostatic clamp in order to maintain consistent deposited charge from workpiece to workpiece. As such, clamping parameters (e.g., clamping voltage and clamping frequency) become responsive parameters which can vary in order to maintain a target set point or range of deposited charge.

In accordance with the present disclosure, an exemplary electrostatic clamp monitoring system 100 is provided in FIG. 1. The electrostatic clamp monitoring system 100, for example, comprises an electrostatic clamp (ESC) 102 configured to selectively electrostatically clamp a workpiece 104 to a clamping surface 106 associated therewith. The ESC 102, for example, comprises one or more electrodes 108 configured to electrostatically attract the workpiece 104 to the surface 106 of the ESC. The ESC 102, for example, comprises a coulombic or Johnsen-Rahbek (J-R) electrostatic chuck.

A power supply 110, for example, is electrically coupled to the electrostatic clamp 102, wherein the power supply is configured to selectively supply a clamping voltage (V) at a clamping frequency (f) to the one or more electrodes 108 of the electrostatic clamp. The power supply 110, for example, is configured to provide alternating current (AC) or direct current (DC). Further, the electrostatic clamp 102, for example, may comprise a single-phase clamp or multiple-phase clamp, such as a three-phase electrostatic clamp, and wherein the power supply 110 is configured to selectively alternately supply a three phase clamping voltage (V) at the clamping frequency (f) to the one or more electrodes 108 of the electrostatic clamp. All such electrostatic clamps 102 and power supplies 110 are contemplated as falling within the scope of the present disclosure.

A data acquisition system 112 is further operably coupled to the power supply 110, wherein the data acquisition system is configured to measure a current (i) associated with the one or more electrodes 108, such as a current supplied to the one or more electrodes, therein defining a measured current. Alternatively, the current is measured directly from the one or more electrodes 108, such as via one or more electrical leads (not shown) associated with the one or more electrodes. The data acquisition system 112, for example, may comprise a stand-along data acquisition (DAQ) box, or may comprise a computer, oscilloscope, or other system with data acquisition software and/or hardware installed or associated therewith. In the case of the power supply 110 providing an alternating current, the data acquisition system 112, for example, is further configured to measure one or more polarities of the current supplied to the one or more electrodes 108.

In accordance with the disclosure, a controller 114 is further provided and configured to integrate the measured current (I) over time, therein defining a determined charge value (Q) associated a clamping force between the workpiece 104 and electrostatic clamp 102. The controller 114 is further configured to selectively vary one or more of the clamping voltage (V) and clamping frequency (f) based on the determined charge value (Q), thereby generally maintaining a desired clamping force between the workpiece 104 and electrostatic clamp 102 by maintaining the determined charge value at a desired value or within a predetermined range of charge values, as will be discussed further infra.

A memory 116 can be further provided and configured to store the clamping voltage (V), clamping frequency (f), and charge value (Q) associated with the clamping force between the workpiece 104 and electrostatic clamp 102 over one or a plurality of clamping cycles.

In order to better understand the present disclosure, an understanding of the operation of the ESC 102 will now be discussed. Charge, Q, between the ESC 102 and the workpiece 104 can be described as:

$$Q = C \times V \qquad (1),$$

wherein V is the clamping voltage provided by the power supply 110, and C is the capacitance between the ESC 102 and workpiece 104. When the clamping voltage V is applied to the ESC 102 (e.g., to the one or more electrodes 108 via the power supply 110), an inrush of current i is experienced by the one or more electrodes 108. However, as the capacitor that is defined by the workpiece 104 and ESC 102 charges to full charge, the amount of current drops asymptotically.

Accordingly, an integration circuit (e.g., a numerical integrator) is associated with the controller 114, wherein the charge can be determined. A summation of the current i over the time intervals t thus provides an amount of charge Q on the ESC 102. Clamping pressure P is proportional to charge density squared σ:

$$P \sim \gamma(\sigma^2/\varepsilon) \qquad (2),$$

where γ is either a derived coefficient representative of the type of electrostatic clamp and geometric consideration or a free parameter used to match the measured current with the independently measured clamping pressure, and ε is the permittivity of free space. Thus, when a charge Q is imposed on a known area A of the electrode 108 of the ESC 102, the clamping pressure P experienced between the workpiece 104 and the ESC is proportional to the charge density σ on the electrode.

Thus, the present invention presently appreciates that the clamping pressure P that is created by the ESC 102 can be assessed based simply on how much charge Q is placed on the ESC. It should be noted that the time it takes to charge up capacitor defined by the ESC 102 and workpiece 104 is often much shorter than the time that the clamping voltage V is applied, and a DC drain current is often evidenced through the ESC. Accordingly, the charge Q can be written as:

$$Q = \Sigma_1^n (i_n - i_{bkg}) \Delta t \qquad (3),$$

where $i_n$ is the measured current during interval n, which can be determined by averaging over the interval or selecting the current at one of the endpoints as being representative, $i_{bkg}$ is background current (e.g., a constant associated with the DC drain current) and t is the time interval. Accordingly, taking a corrected current and multiplying by a time interval provides the charge on the ESC 102. Another way of writing the charge Q is:

$$Q = \int_0^t (i - i_{bkg}) dt \qquad (4).$$

The integration can be accommodated by the controller 114, and the instantaneous and build-up of charge Q can be can be collected by the data acquisition system 112 continually during many cycles of the ESC 102 and clamping of many workpiece 104, and stored in the memory 116. As such, for example, months of charge data from the cycling of the ESC 102 can be achieved, and the charge data can be compared to presently-measured charge data (e.g., from present current measurements) in order to determine a "health" or clamping capability of the ESC. A plurality of charge values and clamping forces associated therewith can be further defined, wherein the controller 114 is further configured to determine a clamping status (e.g., clamping force) of the electrostatic clamp 102. Further, a comparison of a currently determined charge value can be made to the plurality of charge values. The controller 114, for example, is configured to determine one or more of a current status and a predicted future status of the clamping capability of the electrostatic clamp 102 based on the currently determined charge value and the plurality of charge values, such as by a comparison of the currently determined charge value and the plurality of charge values. Alternatively or in addition, the controller 114 is configured to determine the current status and/or predicted future status of the clamping capability directly based on the measurement of the current. According to another example, a model 118 of the ESC 102 can be ascertained (e.g., based on capacitance, resistance, RC time constant of the ESC, etc.), wherein the model is further utilized to determine the one or more of the current status and future status of the clamping capability of the ESC 102.

As stated previously, the controller 114 of the present disclosure is configured to selectively vary one or more of the clamping voltage (V) and clamping frequency (t) based on the determined charge value (Q), in order to generally maintain the desired clamping force between the workpiece 104 and electrostatic clamp 102 by maintaining the determined charge value at a desired value or within a predetermined range of charge values. Selectively varying one or more of the clamping voltage and clamping frequency, for example, maintains the current supplied to the one or more electrodes 108, therein maintaining the desired clamping force between the workpiece 104 and electrostatic clamp 102.

The desired clamping force or range of desired clamping forces between the workpiece 104 and electrostatic clamp 102, for example, can be associated with a predetermined range of desired charge values, wherein selectively varying the one or more of the clamping voltage and clamping frequency generally maintains the current supplied to the one or more electrodes 108 such that the determined charge value remains within the predetermined range of desired charge values.

Figure 2:
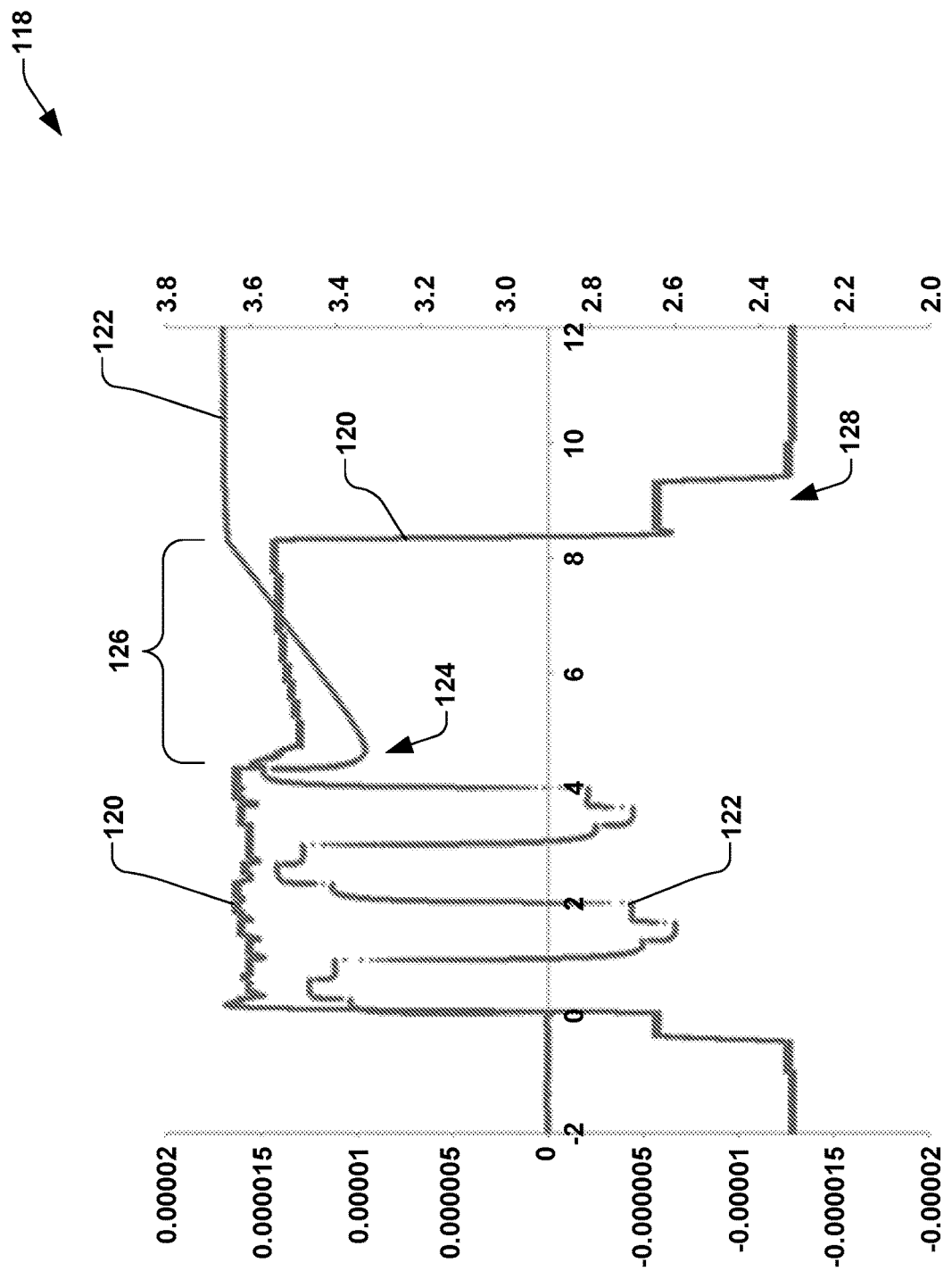
FIG. 2 is a graph illustrating a comparison of charge determined by the present disclosure to measured capacitance according to another aspect.

As illustrated in FIG. 2, two example traces are illustrated in graph 118. Trace 120 refers to capacitance that the ESC 102 of FIG. 1 reports, which is an independent measure of capacitance of the ESC while clamping the workpiece 104. Trace 122 of FIG. 2 refers to the charge Q that is integrated through repetitive cycles of AC voltage by the controller 114 of FIG. 1 for a full clamping cycle. Trace 122 of FIG. 2 is thus the charge that is left on the ESC at any given time. It should be noted that the graph 118 is not to be taken in a limiting sense, and it is but one example of a full clamping cycle under a given set of circumstances. Accordingly, trace 120 and trace 122 can vary significantly based on various factors.

As illustrated, trace 120 dips at point 124 and is then flat during region 126, and again drops at 128. The flat portion of region 126 is an interval where the voltage V from the power supply 110 of FIG. 1 is turned off, and the capacitance would be expected to drop to zero. However, the capacitance does not fall to zero, thus indicating a fault or anomaly, such as a workpiece "sticking" to the ESC 102. As evidenced by the trace 122, there is still charge stored on the ESC in the flat region 126, and the charge is unexpected compared to traces from previous measurements (not shown). Accordingly, the flat region 126 of trace 122 illustrates anomalous behavior of charge Q on the ESC 102. Thus, the data illustrated in the graph 118 of FIG. 2 correlates the integrated charge Q with visible/macro malfunctions that are measured externally. As such, the integrated charge Q of the present disclosure can be utilized as both an in-situ and predictive method for determining the clamping capability or "health" of an ESC 102.

Figure 3:
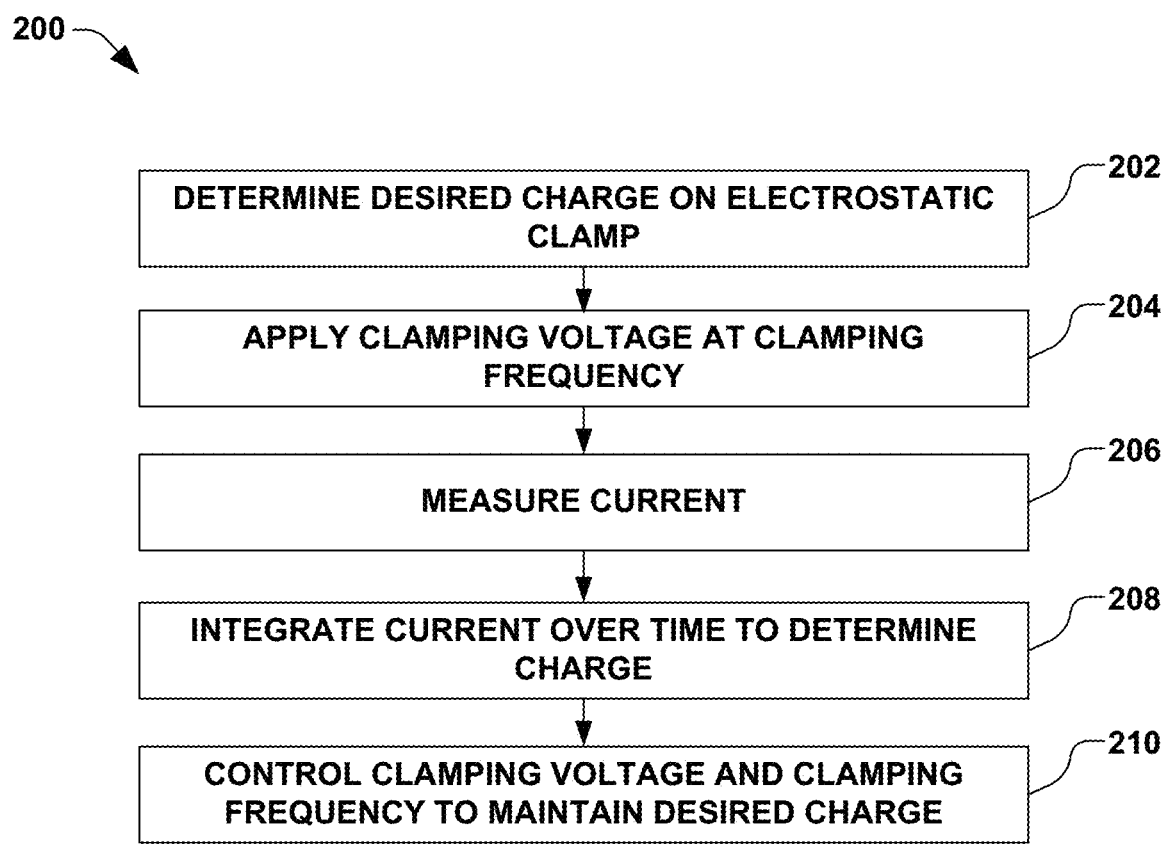
FIG. 3 illustrates a methodology for maintaining a clamping capability associated with an electrostatic clamp, in accordance with another example.

In accordance with a further aspect of the disclosure, FIG. 3 illustrates an exemplary method 200 for monitoring and maintaining an electrostatic clamping force of an electrostatic clamp. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 200 of FIG. 3 begins at act 202, wherein a desired charge or predetermined range of charges associated with the electrostatic clamp and workpiece is determined. The desired charge or predetermined range of charges, for example, can be determined empirically through what is called a "pop-off test", or they can provided as value(s) at which the workpiece is adequately clamped to the electrostatic clamp.

In act 204, a clamping voltage V is applied to one or more electrodes of an electrostatic clamp at a clamping frequency f, therein electrostatically attracting a workpiece to a clamping surface of the electrostatic clamp. In act 206, a current i associated with the clamping voltage V applied to the one or more electrodes is measured, therein defining a measured current. The measured current is integrated over time in act 208, therein defining a charge value Q associated with a clamping force between the workpiece and electrostatic clamp. The charge value Q, for example, can be optionally stored in a memory.

In act 210, one or more of the clamping voltage (V) and clamping frequency (f) are controlled based on the charge value Q, wherein the charge value Q is maintained at a constant or within the predetermined range charges provided in act 202. Thus, the clamping force between the workpiece 104 and electrostatic clamp 102 is maintained at a generally constant clamping force or within a desired range of clamping forces.

Controlling the one or more of the clamping voltage and clamping frequency applied to the electrostatic clamp in act 210, for example, can be further based on a plurality of charge values that are previously stored. The variation in the clamping voltage and clamping frequency can be based on a comparison of the charge that is currently determined to the plurality of charge values stored in memory. In another example, controlling one or more of the clamping voltage and clamping frequency is based, at least in part, on a numerical model based on the plurality of charge values previously stored, which can further predict the validity of subsequent charge values.

Figure 4:
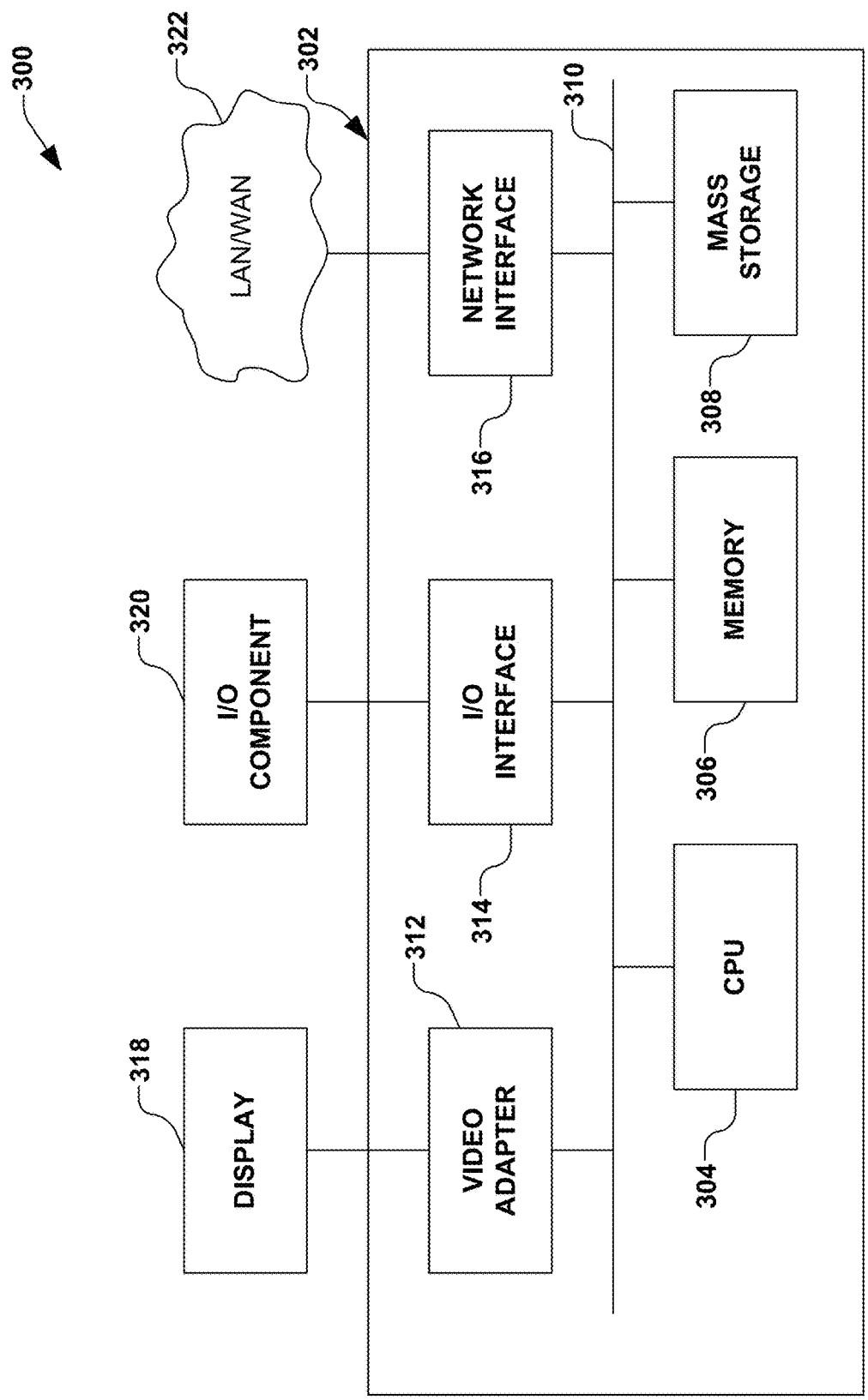
FIG. 4 illustrates a schematic representation of an exemplary processor-based system for maintaining a clamping capability associated with an electrostatic clamp.

In accordance with another aspect, the aforementioned methodology may be implemented using computer program code in one or more general purpose computer or processor based system. As illustrated in FIG. 4, a block diagram is provided of a processor based system 300 is provided in accordance with another embodiment. For example, the controller 114 of FIG. 1 may comprise the processor based system 300 of FIG. 4. The processor based system 300, for example, is a general purpose computer platform and may be used to implement processes discussed herein. The processor based system 300 may comprise a processing unit 302, such as a desktop computer, a workstation, a laptop computer, or a dedicated unit customized for a particular application. The processor based system 300 may be equipped with a display 318 and one or more input/output devices 320, such as a mouse, a keyboard, or printer. The processing unit 302 may include a central processing unit (CPU) 304, memory 306, a mass storage device 308, a video adapter 312, and an I/O interface 314 connected to a bus 310.

The bus 310 may be one or more of any type of several bus architectures including a memory bus or memory controller, a peripheral bus, or video bus. The CPU 304 may comprise any type of electronic data processor, and the memory 306 may comprise any type of system memory, such as static random access memory (SRAM), dynamic random access memory (DRAM), or read-only memory (ROM).

The mass storage device 308 may comprise any type of storage device configured to store data, programs, and other information and to make the data, programs, and other information accessible via the bus 310. The mass storage device 308 may comprise, for example, one or more of a hard disk drive, a magnetic disk drive, or an optical disk drive.

The video adapter 312 and the I/O interface 314 provide interfaces to couple external input and output devices to the processing unit 302. Examples of input and output devices include the display 318 coupled to the video adapter 312 and the I/O device 320, such as a mouse, keyboard, printer, and the like, coupled to the I/O interface 314. Other devices may be coupled to the processing unit 302, and additional or fewer interface cards may be utilized. For example, a serial interface card (not shown) may be used to provide a serial interface for a printer. The processing unit 302 also may include a network interface 316 that may be a wired link to a local area network (LAN) or a wide area network (WAN) 322 and/or a wireless link.

It should be noted that the processor based system 300 may include other components or exclude some components described herein. For example, the processor based system 300 may include power supplies, cables, a motherboard, removable storage media, cases, and the like. These other components, although not shown, are considered part of the processor based system 300.

Embodiments of the present disclosure may be implemented on the processor based system 300, such as by program code executed by the CPU 304. Various methods according to the above-described examples and embodiments may be implemented by program code. Accordingly, explicit discussion herein is omitted.

Further, it should be noted that any control modules and/or control of the system 100 in FIG. 1 may all be implemented on one or more processor based systems 300 of FIG. 4. Communication between the different modules and devices may vary depending upon how the modules are implemented. If the modules are implemented on one processor based system 300, data may be saved in memory 306 or mass storage 308 between the execution of program code for different steps by the CPU 304. The data may then be provided by the CPU 304 accessing the memory 306 or mass storage 308 via bus 310 during the execution of a respective step. If modules are implemented on different processor based systems 300 or if data is to be provided from another storage system, such as a separate database, data can be provided between the systems 300 through I/O interface 314 or network interface 316. Similarly, data provided by the devices or stages may be input into one or more processor based system 300 by the I/O interface 314 or network interface 316. A person having ordinary skill in the art will readily understand other variations and modifications in implementing systems and methods that are contemplated within the scope of varying embodiments.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

What is claimed is:

1. A system for controlling electrostatic clamping pressure, the system comprising:
an electrostatic clamp configured to selectively electrostatically clamp a workpiece to a clamping surface associated therewith via one or more electrodes;
a power supply electrically coupled to the electrostatic clamp, wherein the power supply is configured to selectively supply a clamping voltage at a clamping frequency to the one or more electrodes of the electrostatic clamp;
a data acquisition system operably coupled to the power supply and configured to measure a current supplied to the one or more electrodes, therein defining a measured current; and
a controller configured to integrate the measured current over time, therein defining a determined charge value associated with a clamping force between the workpiece and electrostatic clamp, and wherein the controller is further configured to selectively vary one or more of the clamping voltage and clamping frequency based on the determined charge value, thereby maintaining a desired clamping force between the workpiece and electrostatic clamp, wherein selectively varying the one or more of the clamping voltage and clamping frequency maintains the current supplied to the one or more electrodes, therein maintaining the desired clamping force between the workpiece and electrostatic clamp.

2. The system of claim 1, further comprising a memory configured to store the charge value associated with the clamping force.

3. The system of claim 2, wherein the memory is further configured to store a plurality of clamping voltages and a plurality of clamping frequencies associated with a respective plurality of charge values over a plurality of clamping cycles.

4. The system of claim 3, wherein the controller is further configured to determine a clamping capability status of the electrostatic clamp based on a comparison of the determined charge value to the plurality of charge values.

5. The system of claim 1, wherein the controller comprises a numerical integrator configured to perform a numerical integration of the measured current.

6. The system of claim 1, wherein the power supply comprises an A/C power supply, and wherein the data acquisition system is further configured to measure one polarity of the current supplied to the one or more electrodes.

7. The system of claim 1, wherein the electrostatic clamp comprises a three-phase electrostatic clamp, and wherein the power supply is configured to selectively alternately supply a three phase clamping voltage to the one or more electrodes of the electrostatic clamp.

8. A system for controlling electrostatic clamping pressure, the system comprising:
an electrostatic clamp configured to selectively electrostatically clamp a workpiece to a clamping surface associated therewith via one or more electrodes;
a power supply electrically coupled to the electrostatic clamp, wherein the power supply is configured to selectively supply a clamping voltage at a clamping frequency to the one or more electrodes of the electrostatic clamp;
a data acquisition system operably coupled to the power supply and configured to measure a current supplied to the one or more electrodes, therein defining a measured current; and
a controller configured to integrate the measured current over time, therein defining a determined charge value associated with a clamping force between the workpiece and electrostatic clamp, and wherein the controller is further configured to selectively vary one or more of the clamping voltage and clamping frequency based on the determined charge value, thereby maintaining a desired clamping force between the workpiece and electrostatic clamp, wherein the desired clamping force between the workpiece and electrostatic clamp is associated with a predetermined range of desired charge values, and wherein selectively varying the one or more of the clamping voltage and clamping frequency maintains the current supplied to the one or more electrodes such that the determined charge value remains within the predetermined range of desired charge values.

9. The system of claim 8, wherein the desired clamping force comprises a range of desired clamping forces.

10. The system of claim 8, further comprising a memory configured to store the charge value associated with the clamping force.

11. The system of claim 10, wherein the memory is further configured to store a plurality of clamping voltages and a plurality of clamping frequencies associated with a respective plurality of charge values over a plurality of clamping cycles.

12. The system of claim 11, wherein the controller is further configured to determine a clamping capability status of the electrostatic clamp based on a comparison of the determined charge value to the plurality of charge values.

13. The system of claim 8, wherein the controller comprises a numerical integrator configured to perform a numerical integration of the measured current.

14. The system of claim 8, wherein the power supply comprises an A/C power supply, and wherein the data acquisition system is further configured to measure one polarity of the current supplied to the one or more electrodes.

15. The system of claim 8, wherein the electrostatic clamp comprises a three-phase electrostatic clamp, and wherein the power supply is configured to selectively alternately supply a three phase clamping voltage to the one or more electrodes of the electrostatic clamp.

16. A system for controlling electrostatic clamping pressure, the system comprising:
an electrostatic clamp configured to selectively electrostatically clamp a workpiece to a clamping surface associated therewith, wherein the electrostatic clamp comprises one or more electrodes;
a power supply configured to selectively supply a clamping voltage at a clamping frequency to the one or more electrodes, therein selectively electrostatically clamping the workpiece to the clamping surface;
a data acquisition system configured to measure a current associated with the clamping voltage and clamping frequency, therein defining a measured current; and
a controller configured to integrate the measured current over time, therein defining a determined charge value associated with a clamping force between the workpiece to the electrostatic clamp, and wherein the controller is further configured to selectively vary one or more of the clamping voltage and clamping frequency based on the determined charge value, therein controlling the clamping force between the workpiece and electrostatic clamp, wherein selectively varying the one or more of the clamping voltage and clamping frequency controls the current supplied to the one or more electrodes, therein maintaining a desired clamping force between the workpiece and electrostatic clamp.

17. The system of claim 16, wherein the controller is configured to maintain a substantially constant clamping force between the workpiece and electrostatic clamp via the selective variation of the one or more of the clamping voltage and clamping frequency.

18. The system of claim 16, further comprising a memory configured to store a plurality of charge values associated with a plurality of clamping forces over a plurality of clamping cycles.

19. The system of claim 16, wherein the controller comprises a numerical integrator configured to perform a numerical integration of the measured current.

20. The system of claim 16, wherein the power supply comprises an A/C power supply, and wherein the data acquisition system is further configured to measure one polarity of the current supplied to the one or more electrodes.

* * * * *